US005549786A

United States Patent [19]
Jones et al.

[11] Patent Number: 5,549,786
[45] Date of Patent: Aug. 27, 1996

[54] HIGHLY SELECTIVE, HIGHLY UNIFORM PLASMA ETCH PROCESS FOR SPIN-ON GLASS

[75] Inventors: Stephen A. Jones; Shyam G. Garg; James F. Buller; Miguel Santana, Jr., all of Austin, Tex.

[73] Assignee: Advanced Micro Devices, Inc., Sunnyvale, Calif.

[21] Appl. No.: 520,758

[22] Filed: Aug. 29, 1995

[51] Int. Cl.$^6$ .................................................. H01L 21/00
[52] U.S. Cl. ............................ 156/662.1; 156/646.1; 156/643.1
[58] Field of Search ................... 156/646.1, 643.1, 156/662.1, 657.1

[56] References Cited

U.S. PATENT DOCUMENTS

| | | | |
|---|---|---|---|
| 4,430,152 | 2/1984 | Okano | 156/643 |
| 4,683,024 | 7/1987 | Miller et al. | 156/643 |
| 4,863,561 | 9/1989 | Freeman et al. | 156/646 |
| 5,260,096 | 11/1993 | Holzl et al. | 427/215 |
| 5,269,879 | 12/1993 | Rhoades et al. | 156/643 |
| 5,284,548 | 2/1994 | Barnes et al. | 156/662 |
| 5,352,913 | 10/1994 | Chung et al. | 257/301 |
| 5,365,095 | 11/1994 | Shono et al. | 257/295 |
| 5,436,188 | 7/1995 | Chen | 437/52 |

FOREIGN PATENT DOCUMENTS

| | | |
|---|---|---|
| 03157659 | 7/1991 | Japan . |
| 03296217 | 12/1991 | Japan . |
| 05243226 | 9/1993 | Japan . |
| 06132252 | 5/1994 | Japan . |

OTHER PUBLICATIONS

"Silicon Processing For The VLSI Era—vol. 1—Process Technology"; Wolf et al.; Lattice Press; Sunset Beach, Calif. ©1986; pp. 233–236.

*Primary Examiner*—R. Bruce Breneman
*Assistant Examiner*—George Goudreau
*Attorney, Agent, or Firm*—Kevin L. Daffer

[57] ABSTRACT

An SOG plasma etch process is presented which is optimized for selectivity to PECVD silicon nitride. The present process also produces a uniform etch across the exposed surface of a semiconductor wafer. The etch process finds utility in dielectric-SOG-dielectric structures used as passivation layers. Silicon nitride is deposited using a PECVD technique to form the dielectric layers. By etching SOG at a faster rate than the rate at which it etches PECVD silicon nitride, the SOG plasma etch process removes enough of the SOG layer to prevent delamination problems associated with SOG layers interposed between dielectric layers without significantly reducing the thickness of the first dielectric layer. SOG remains only in troughs between closely-spaced interconnects and adjacent to the vertical steps between widely-spaced interconnects. Flow rates of He, $CHF_3$, and $N_2$ gases are established through a reaction chamber of a plasma etch system. The method includes pre-stabilizing steps, followed by an etch step, which is then followed by a post-stabilizing step and a particle removal or by-product flush step.

16 Claims, 4 Drawing Sheets

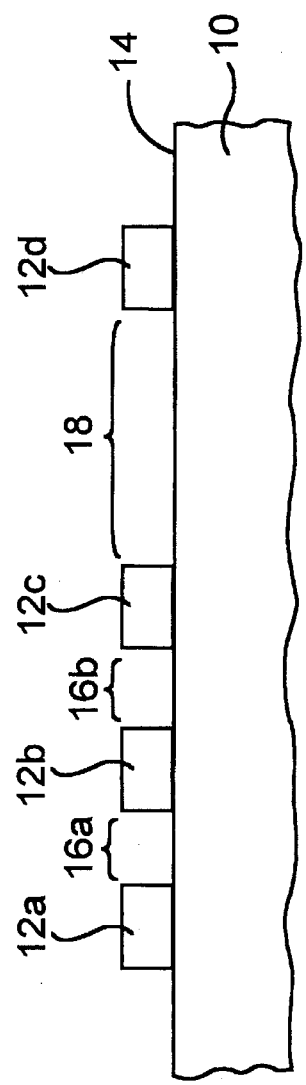
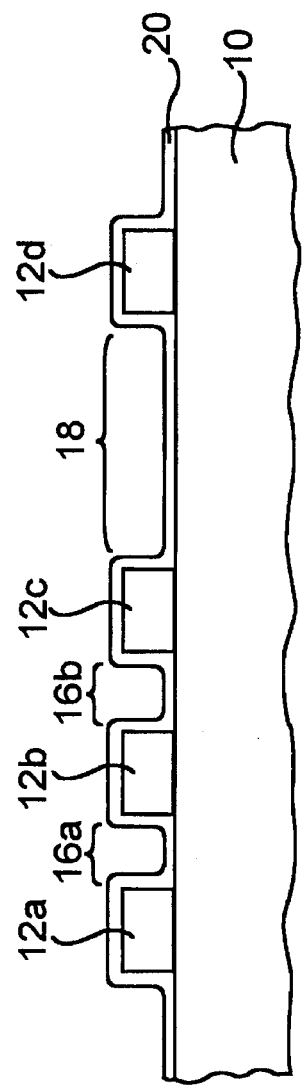
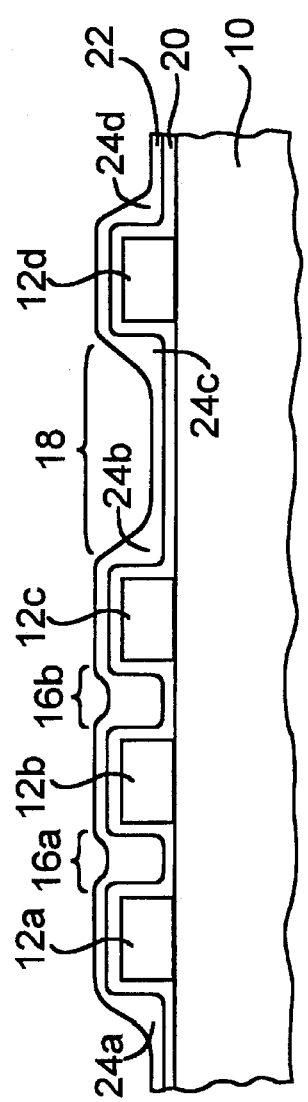

HIGHLY SELECTIVE, HIGHLY UNIFORM PLASMA ETCH PROCESS FOR SPIN-ON GLASS

BACKGROUND OF THE INVENTION

1. Field of the Invention

This invention relates to integrated circuit fabrication and more particularly to a process for plasma etching of a spin-on glass (SOG) layer used in forming a highly effective passivation layer.

2. Description of the Relevant Art

An integrated circuit consists of electronic devices electrically coupled by conductive trace elements called interconnect lines (interconnects). Interconnects are patterned from layers of electrically conductive materials (e.g., aluminum, doped polysilicon, etc.) formed on the surface of a silicon wafer. Multiple layers (or levels) of closely-spaced interconnects allow an increase in the density of devices formed on semiconductor wafers. Electrical separation of stacked interconnect layers is achieved by placing an electrically insulating material (i.e., interlevel dielectric layer) between the vertically spaced interconnect layers. Following patterning of the final interconnect layer, a passivation layer is deposited over the entire top surface of the integrated circuit. This passivation layer protects the integrated circuit from mechanical and chemical damage during assembly and packaging operations.

Interconnects in the final interconnect layer are commonly patterned from aluminum or aluminum alloys. The relatively low melting point of aluminum (and aluminum alloys) precludes the formation of passivation layers with many standard techniques. Common dielectric materials used for passivation layers include phosphorus-doped silicon dioxide (oxide) and silicon nitride. Phosphorus-doped oxide is typically deposited over aluminum interconnects of a final interconnect layer using a low-temperature chemical vapor deposition (CVD) process. Silicon nitride is typically deposited over aluminum interconnects of a final interconnect layer using a plasma enhanced CVD (PECVD) process.

In general, thicker passivation layers provide better protection of underlying structures. However, when the thickness of a passivation layer becomes appreciable with respect to the distance between closely-spaced interconnects in the final interconnect layer, air pockets (i.e., voids) may form between the closely-spaced interconnects during the formation of the passivation layer. One way to achieve a relatively thick passivation layer while avoiding the void creation problem is to employ a layer of a spin-on glass (SOG) material interposed between two layers of a common CVD dielectric material used for passivation.

SOG is becoming a popular interlevel dielectric material. Common SOG materials include silicates or siloxanes mixed in alcohol-based solvents. Siloxane-based SOG materials have organic methyl ($CH_3$) or phenyl ($C_6H_5$) groups added to improve cracking resistance. Applied to a wafer surface in liquid form, SOG materials typically flow over and fill narrow spaces between interconnects without creating voids. In addition, SOG materials produce a surface smoothing effect at vertical edges. SOG materials are thus frequently used to planarize the upper surface of interlevel dielectric layers.

During a typical SOG application, a layer of a liquid SOG material is first applied over the surface of a silicon wafer. The SOG layer is then cured by heating the wafer in a furnace. A typical SOG curing process includes two heating steps. A first heating step is carried out at a relatively low temperature (e.g., 150°–250° C. for 1–15 minutes in air) to drive the solvent out of the SOG layer. A second heating step is then performed at a higher temperature (e.g., 400°–425° C. for 30–60 minutes in air) to drive out water formed during polymerization of the SOG material. The remaining solid SOG film exhibits dielectric properties similar to those of an oxide film.

SOG materials have many drawbacks, however. When an SOG layer is formed to the thickness required of an interlevel dielectric, it exhibits an intolerable degree of cracking. In addition, adhesion failures are often observed at interfaces between SOG layers and metal interconnects. Delamination problems (i.e., adhesion failures at interfaces between SOG layers and overlying and underlying dielectric layers) have also been experienced. Further, the density of SOG oxide is relatively low, leading to a high degree of water sorption. Diffusion of water from the SOG material into contact regions results in high resistance failures of electrical contacts formed in holes etched through the interlevel dielectric layers between interconnect levels.

In order to reduce the problems associated with SOG materials, many surface planarization methods employ an SOG layer interposed between two other dielectric layers. The other dielectric layers are used to reduce the SOG water sorption problem and are typically deposited using chemical vapor deposition (CVD) techniques. The other dielectric layers encapsulate the SOG layer, reducing the diffusion of water from the SOG material into contact regions. Being relatively thin and substantially conformal, the other dielectric layers do not significantly enhance the planarity of the surface topography. There are two common variations of the dielectric-SOG-dielectric planarization approach: (i) etchback SOG, and (ii) non-etchback SOG. See, S. Wolf, *Silicon Processing for the VLSI Era*, Vol. 2, pp. 233–236.

In the non-etchback SOG variation of the dielectric-SOG-dielectric planarization approach, special non-organic, crack-resistant silicate SOG materials are used. Silicate-based SOG materials do not absorb moisture as readily as siloxane-based SOG materials. In a typical application of the non-etchback SOG approach, a first CVD dielectric layer is initially formed over an interconnect level arranged on a surface of a silicon wafer. A layer of silicate-based SOG is then applied over the first CVD dielectric layer and cured using a heating process. A second CVD dielectric layer is then formed over the SOG layer.

The major drawback of the non-etchback SOG variation of the dielectric-SOG-dielectric structure is that it does not prevent water in the SOG layer from diffusing to contact regions when electrical contacts are formed in vias. In the widely adopted etchback SOG variation of the dielectric-SOG-dielectric planarization method, a layer of a siloxane-based SOG material is applied over a first CVD dielectric layer. Portions of the SOG layer and the uppermost layer of the first CVD dielectric layer are then removed using a dry plasma etch process prior to deposition of a second CVD dielectric layer. In this manner, SOG material is removed in areas where vias will be etched and contacts formed. This prevents any water in the SOG layer from diffusing into the contact regions. SOG remains only in troughs or valleys between closely-spaced interconnects and adjacent to the vertical steps between widely-spaced interconnects. The remaining SOG substantially fills troughs or valleys between closely-spaced interconnects, and reduces sudden changes in elevation adjacent to widely-spaced interconnects.

In a passivation layer application of dielectric-SOG-dielectric structures, delamination problems (i.e., adhesion failures at interfaces between the SOG layer and overlying and underlying dielectric layers) experienced with the non-etchback SOG approach have prompted the use of the etchback SOG approach. One drawback to the etchback SOG approach, however, is that the etch process used to remove portions of the SOG layer also removes any exposed portions of the first CVD dielectric layer. In order to remove enough of the SOG layer to prevent delamination, a significant portion of the first dielectric layer is exposed and removed. As a result, the thickness of the first dielectric layer is undesirably reduced.

It would thus be desirable to have an etchback SOG process which etches an SOG layer at a faster rate than the rate at which it etches an underlying first dielectric layer (i.e., an SOG plasma etch process selective to the first dielectric layer). Such a plasma etch process would remove enough of the SOG layer to prevent delamination problems associated with SOG layers interposed between dielectric layers without significantly reducing the thickness of the first dielectric layer.

SUMMARY OF THE INVENTION

The problems outlined above are in large part solved by an SOG plasma etch process optimized for (i) selectivity to a first dielectric layer of silicon nitride formed using a PECVD technique, (ii) etch rate, and (iii) etch uniformity across a frontside surface of an upper topography of a silicon wafer. Used in an etchback SOG approach to the formation of a dielectric-SOG-dielectric passivation structure, the SOG plasma etch process removes SOG material at a faster rate than the rate at which it etches an underlying first dielectric layer. The plasma etch process thus removes enough of the SOG layer to prevent the delamination problem associated with SOG layers interposed between dielectric layers without significantly reducing the thickness of the first dielectric layer. SOG remains only in troughs between closely-spaced interconnects and adjacent to the vertical steps between widely-spaced interconnects.

Silicon nitride is used as a passivation layer material due to its ability to provide an impermeable barrier to moisture and mobile impurities (e.g., sodium ions). Silicon nitride also forms a tough coating that protects an underlying integrated circuit against mechanical damage (e.g., scratching).

In a typical application of the SOG plasma etch process during the formation of a dielectric-SOG-dielectric passivation structure, a layer of an electrically conductive material (e.g., aluminum, doped polysilicon, etc.) is formed over a frontside surface of an upper topography of a silicon wafer. The layer of electrically conductive material is then patterned to form a final level of coplanar interconnects. A first dielectric layer of PECVD silicon nitride is deposited over and between the interconnects of the final interconnect level. A layer of SOG is then formed over the PECVD silicon nitride layer. The plasma etch process of the present invention is then used to remove portions of the SOG layer. SOG remains only in troughs between closely-spaced interconnects and adjacent to the vertical steps between widely-spaced interconnects. A second dielectric layer of PECVD silicon nitride is then formed over the remaining portions of the SOG layer to complete the dielectric-SOG-dielectric passivation structure.

As defined herein, closely-spaced interconnects are laterally spaced a distance equal to or less than twice a minimum interconnect line width. Widely-spaced interconnects are laterally spaced a distance equal to or greater than six times a minimum interconnect line width.

Broadly speaking, the SOG plasma etch method for removing a portion of a spin-on glass (SOG) layer formed over a layer of PECVD silicon nitride on a frontside surface of an upper topography of a silicon wafer includes the steps of (i) placing the silicon wafer in a gap between a pair of electrodes arranged within an evacuated reaction chamber, (ii) establishing a flow of He, $CHF_3$, and $N_2$ gases through said reaction chamber, (iii) adjusting the pressure within the reaction chamber, (iv) applying RF power between the pair of electrodes in order to form a plasma in the gap between the pair of electrodes, (v) ceasing the flow of He, $CHF_3$, and $N_2$ gases through said reaction chamber, and (vi) establishing a flow of argon (At) gas through said reaction chamber in order to expel etch by-products from the reaction chamber.

The present plasma etch process is selective to PECVD silicon nitride. In other words, the plasma etch process chemically etches the SOG layer at a faster rate than the rate at which it etches the first PECVD silicon nitride layer. It is postulated that incorporation of $N_2$ gas into the flow of reactant gases results in nitrogen atoms, ions, and radicals in the plasma. These nitrogen atoms, ions, and radicals freely combine with any reactive species which might chemically react with PECVD silicon nitride before the reactive species react with and remove silicon nitride from a frontside surface of an upper topography of a silicon wafer. The flow rate of $N_2$ gas and the other reactant gases are optimized to produce an acceptable etch rate and etch uniformity across the exposed frontside topological surface.

Experiments conducted in order to optimize flow rates of reactant gases yielded selectivities to PECVD silicon nitride of about 2.3, SOG etch rates of about 6,300 angstroms per minute, and etch non-uniformity values of about 3.1 percent across a frontside surface of a silicon wafer. Etch non-uniformity was measured by first forming a layer of SOG over a frontside surface of a silicon wafer. The SOG layer was then etched back using the present technique. SOG layer thickness was then measured at 49 sites on the frontside surface. Percent non-uniformity is equal to the standard deviation of the 49 measurements times 100 and divided by the mean.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of an upper topography of a silicon wafer with interconnects formed on a frontside surface the upper topography;

FIG. 2 is a partial cross-sectional view of the upper topography of FIG. 1 with a first PECVD silicon nitride layer deposited over the frontside surface;

FIG. 3 is a partial cross-sectional view of the upper topography of FIG. 2 with an SOG layer formed over first PECVD silicon nitride layer;

Figure 4:
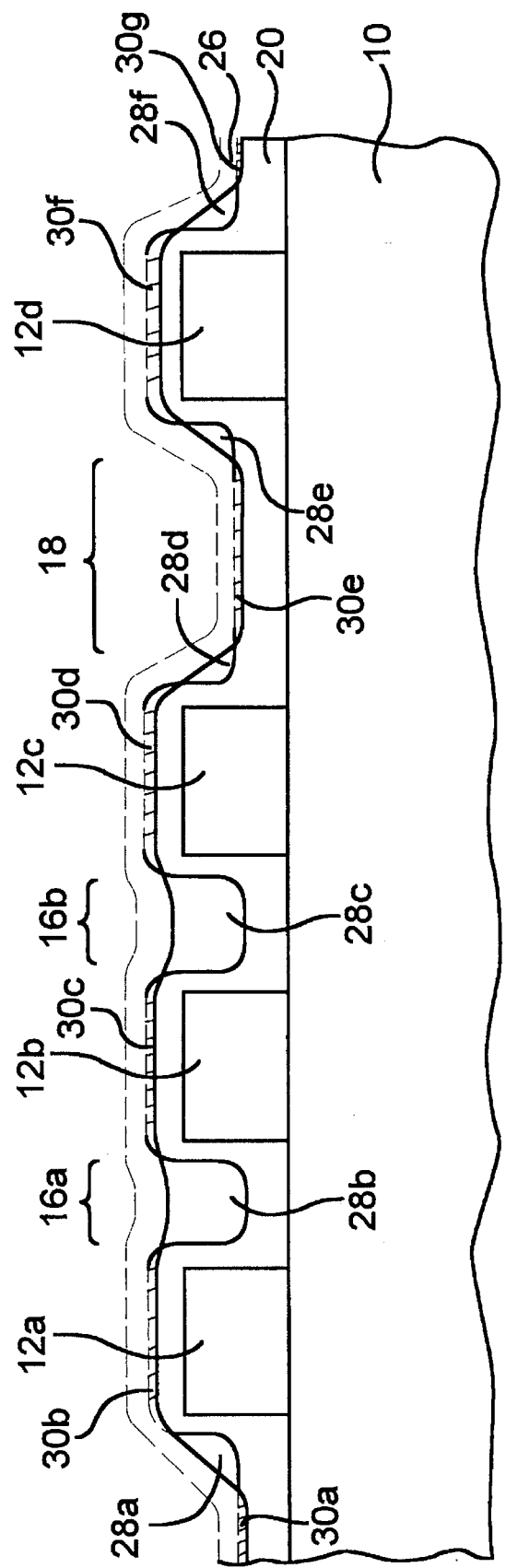
FIG. 4 is a partial cross-sectional view of the upper topography of FIG. 3 following application of the SOG plasma etch process of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1–6 will be used to describe an etchback SOG approach to the formation of a dielectric-SOG-dielectric structure. The etchback SOG approach employs an improved SOG plasma etch process of the present invention. FIG. 1 is a partial cross-sectional view of an upper topography 10 of a silicon wafer with interconnects 12a–d formed on a frontside surface 14 of upper topography 10. Interconnects 12a–d are typically created by first forming a layer of an electrically conductive material (e.g., aluminum, doped polysilicon, etc.) on frontside surface 14 of upper topography 10, then etching away portions of the layer of electrically conductive material to form a pattern or network of interconnects.

In a typical passivation layer application, upper topography 10 includes a number of alternating dielectric and interconnect layers formed upon an upper surface of a silicon wafer. It is also possible that the interconnect layer including interconnects 12a–d is the first, final, and only interconnect layer. In this case, upper topography 10 may be the upper surface of the silicon wafer.

As depicted in FIG. 1, interconnects 12a–c are relatively closely spaced, while interconnect 12d is relatively widely spaced from closest interconnect 12c. Closely-spaced regions 16a and 16b are formed between closely-spaced interconnects 12a and 12b, and between closely-spaced interconnects 12b and 12c, respectively. Widely-spaced region 18 is formed between widely-spaced interconnects 12c and 12d.

FIG. 2 is a partial cross-sectional view of upper topography 10 of FIG. 1 with a first PECVD silicon nitride layer 20 deposited over frontside surface 14. First PECVD silicon nitride layer 20 forms a conformal layer over interconnects 12a–d and portions of frontside surface 14 in regions between interconnects, including closely-spaced regions 16a–b and widely-spaced region 18.

First PECVD silicon nitride layer 20 may be deposited using well-known PECVD techniques. One such method involves placing upper topography 10 in a CVD reaction chamber containing dichlorosilane ($SiCl_2H_2$) and ammonia ($NH_3$), increasing the temperature inside the reaction chamber to between 350° C.–450° C., and reducing the pressure inside the reaction chamber. A layer of PECVD silicon nitride ($Si_3N_4$) may thus formed according to the following reaction:

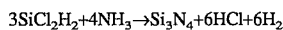

$$3SiCl_2H_2 + 4NH_3 \rightarrow Si_3N_4 + 6HCl + 6H_2$$

In order to avoid the void formation problem between closely-spaced interconnects, the thickness of first PECVD silicon nitride layer 20 typically does not exceed a value equal to one-third the minimum interconnect line spacing.

FIG. 3 is a partial cross-sectional view of upper topography 10 of FIG. 2 with an SOG layer 22 formed over first PECVD silicon nitride layer 20 on frontside surface 14. SOG layer 22 may be formed over frontside surface 14 according to well-known methods. Several steps are typically involved in the formation of SOG layer 22. First, an SOG material is applied to a frontside surface of an upper topography of a silicon wafer in liquid form. The SOG layer is then cured by heating the silicon wafer in a furnace. A typical SOG curing process includes two heating steps, a lower temperature heating step followed by a higher temperature heating step. If sufficient coverage is not obtained with a single coating of an SOG material, the SOG layer formation and curing steps may be repeated.

Common SOG materials include silicates or siloxanes mixed in alcohol-based solvents. Siloxane-based SOG materials have organic methyl ($CH_3$) or phenyl ($C_6H_5$) groups added to improve cracking resistance, and perform well in this application. Suitable siloxane-based SOG materials are available as tradename Accuglass® X-11 series (Allied-Signal, Milpitas, Calif.). Using SOG materials in the Accuglass® X-11 series, uniform SOG layers with thicknesses between 1,000 angstroms and 4,000 angstroms may be formed on a frontside surface of the wafer topography.

A preferred method of applying an SOG material to a frontside surface of an upper topography of a silicon wafer is a spin-coat process. In a spin-coat process, a silicon wafer (i.e., silicon wafer) is typically held on a vacuum chuck. A sufficient amount of a liquid material (e.g., an SOG material) is then deposited in the center of the wafer, and allowed to spread out into a puddle. When the puddle reaches a predetermined diameter, the wafer and vacuum chuck are sent into a rotating motion about an axis near the center of and normal to the planar frontside surface of the wafer. The wafer and vacuum chuck are rapidly accelerated to a predetermined rotational speed. Centrifugal forces spread the liquid material from the center of the wafer to the wafer edge. Excess liquid material is thrown off of the edge of the wafer. An even flow of a liquid material is thus achieved across the frontside surface of the silicon wafer.

The SOG material flows over first PECVD silicon nitride layer 20 on frontside surface 14, filling spaces between closely-spaced interconnects without creating voids. When cured, SOG layer 22 substantially fills closely-spaced regions 16a and 16b between closely-spaced interconnects 12a and 12b, and between closely-spaced interconnects 12b and 12c, respectively. In addition, SOG layer 22 produces a surface smoothing effect at vertical edges 24a–d adjacent to interconnects 12a, 12c, and 12d as shown in FIG. 3.

FIG. 4 is a partial cross-sectional view of upper topography 10 of FIG. 3 following application of the SOG plasma etch process of the present invention. Dashed line 26 shows the outline of the upper surface of SOG layer 22 prior to the SOG plasma etch. Selective to PECVD silicon nitride, the plasma etch process removes most of SOG layer 22 while removing little of first PECVD silicon nitride layer 20. Following the SOG plasma etch, only isolated portions 28a–f of the original SOG layer remain. Only a small amount of the upper portion of first PECVD silicon nitride layer 20 is removed in areas 30a–g.

In a plasma etch process, a glow discharge (i.e., a plasma) is formed when radio frequency (RF) power is applied between two electrodes in a reaction chamber. Reactant gases contained within the reaction chamber produce chemically reactive species (atoms, ions, and radicals). These reactive species diffuse to the surface of the material being etched, and are adsorbed on the surface of the material. A chemical reaction occurs, with the formation of volatile by-products. These by-products are desorbed from the surface and diffuse into the ambient.

In the present plasma etch process, the flow rates of reactant gases are optimized for selectivity to PECVD silicon nitride. The reactant gases are optimally mixed to achieve a uniform etch rate with a low etch non-uniformity (i.e., high etch uniformity) across a frontside surface of an upper topography of a silicon wafer. The plasma etch process steps formulated from experimental results are presented in FIG. 6. Steps include a first pre-stabilize step 30, a second pre-stabilize step 32, an etch/power step 34, a post-stabilize step 36, and a particle removal/flush step 38.

The plasma etch process was optimized in a parallel-electrode (planar) plasma etch system (model Lam Rainbow 4500, Lam Research, Fremont, Calif.). Other suitable reaction chambers include barrel-type etch reactors and downstream plasma etch reactors. The parallel-electrode plasma etch system used has an upper electrode and a lower electrode. During the etch process, RF power is applied to the upper electrode, and the lower electrode is held at ground potential. An impedance matching network is adjusted to maximize the amount of RF power absorbed by the plasma. The resulting setting of the impedance matching network is called a tap value. A backside surface of a silicon wafer (i.e., a planar surface opposite frontside surface 14 of upper topography 10) is positioned on a flat upper surface of the lower electrode. A mechanical structure contained within the reaction chamber descends from above, contacting the edge of upper topography 10 and holding the backside surface of the silicon wafer against the flat upper surface of the lower electrode. Helium (He) gas is used to cool the backside surface of the silicon wafer. The pressure of the helium gas is maintained at a backside pressure (i.e., clamp value) measured in units of Torr relative to a vacuum (i.e., absolute pressure). Gases are introduced into the reaction chamber via an inlet port.

According to a first pre-stabilize step 30, the silicon wafer is placed in a gap between a pair of electrodes within a reaction chamber such that frontside surface 14 of upper topography 10 of the silicon wafer is exposed to a plasma and a flow of reactant gases. Frontside surface 14 is exposed to He, $CHF_3$, and $N_2$ gases at flow rates of 2,800 sccm, 20 sccm, and 60 sccm, respectively. The pressure within the reaction chamber is adjusted to 2,000 mTorr. The RF value of 0/0 signifies an RF power of 0 watts applied between the two electrodes in the reaction chamber, and an associated tap value of 0. The gap value (i.e., the spacing between the pair of electrodes) is maintained at 1.300 cm during first pre-stabilize step 30. A clamp value of 0.0 in first pre-stabilize step 30 signifies that the pressure of the helium gas at the backside surface of the silicon wafer is 0.0 Torr relative to a vacuum (i.e., the flow of backside helium is shut off). A maximum time period (Time) of 30 seconds is allowed for gas flow rates and the reaction chamber pressure to stabilize in first pre-stabilize step 30.

In the plasma etch system used, a vacuum is drawn within the reaction chamber (i.e., the reaction chamber is evacuated) prior to placing the silicon wafer in the gap between the electrodes. Placement of the silicon wafer within the reaction chamber is accomplished from an adjacent and evacuated load lock chamber while the vacuum within the reaction chamber is maintained. Thus adjusting the pressure within the reaction chamber to 2,000 mTorr involves increasing the pressure within the reaction chamber to 2,000 mTorr. In other plasma etch systems, the reaction chamber may be at atmospheric pressure prior to and during the step of placing the silicon wafer in the gap between the electrodes. In this case, adjusting the pressure within the reaction chamber to 2,000 mTorr involves reducing the pressure within the reaction chamber to 2,000 mTorr.

After the completion of first pre-stabilize step 30, a second pre-stabilized step 32 is initiated. The parameters in second pre-stabilized step 32 are the same as those in first pre-stabilize step 30, except that the clamp value (backside He pressure) is increased to 13.0 Torr absolute pressure (i.e., relative to a vacuum). A maximum time period (Time) of 30 seconds is allowed for stabilization of the pressure of the helium gas at the backside surface of the silicon wafer during second pre-stabilize step 32.

After the completion of second pre-stabilize step 32, an etch/power step 34 is initiated. RF power is now applied between the electrodes. Experimental results have shown RF power to be optimum at a value of 800 watts (with associated tap setting of 4) at an electrode gap distance of 1.300 cm. The flow rates of He, $CHF_3$, and $N_2$ gases are maintained at 2,800 sccm, 20 sccm, and 60 sccm, respectively. The clamp value (backside He pressure) is maintained at 13.0 Torr absolute pressure. Etch/power step 34 is preferably carried out for an amount of time required to remove most of SOG layer 22 while removing little of first PECVD silicon nitride layer 20 as shown in FIG. 4. In the experiments conducted, etch/power step 34 was optimally carried out for 13 seconds. The required processing time is directly proportional to the thickness of the SOG layer. Optical emission spectroscopy may also be employed to determine the etch processing time.

After etch/power step 34 is completed, a post-stabilize step 36 is initiated. RF power is removed from between the electrodes. The flow rates of He, $CHF_3$, and $N_2$ gases are decreased to 0. Pressure within the reaction chamber is increased to 3,000 mTorr. Inert argon gas is introduced at a flow rate of 600 sccm in order to flush the reaction by-products from the reaction chamber. The clamp value (backside He pressure) is reduced to 0.0 Torr absolute pressure (i.e., the flow of backside helium is shut off). A maximum time period (Time) of 10 seconds is allowed for stabilization of the gas flow rates and flushing of etch by-products from the reaction chamber.

After the completion of post-stabilize step 36, particle removal/flush step 38 is initiated. The parameters in particle removal/flush step 38 are the same as those in post-stabilize step 36, except that the spacing between the electrodes (i.e., gap) is increased to 5.000 cm. A maximum time period (Time) of 5 seconds is allowed for additional flushing of etch by-products from the reaction chamber and increasing the gap to facilitate handling of the silicon wafer.

Following the plasma etch, SOG layer portions 28b and 28c substantially fill closely-spaced regions 16a and 16b between closely-spaced interconnects 12a and 12b, and between closely-spaced interconnects 12b and 12c, respectively. Closely-spaced regions 16a and 16b are areas where voids are likely to form during deposition of a relatively thick dielectric layer. SOG layer portions 28a, 28d, 28e, and 28f also remain in areas adjacent to vertical steps between widely-spaced interconnects. Enough of SOG layer 22 is removed to prevent delamination problems, while little of first PECVD silicon nitride layer 20 is removed.

Figure 5:
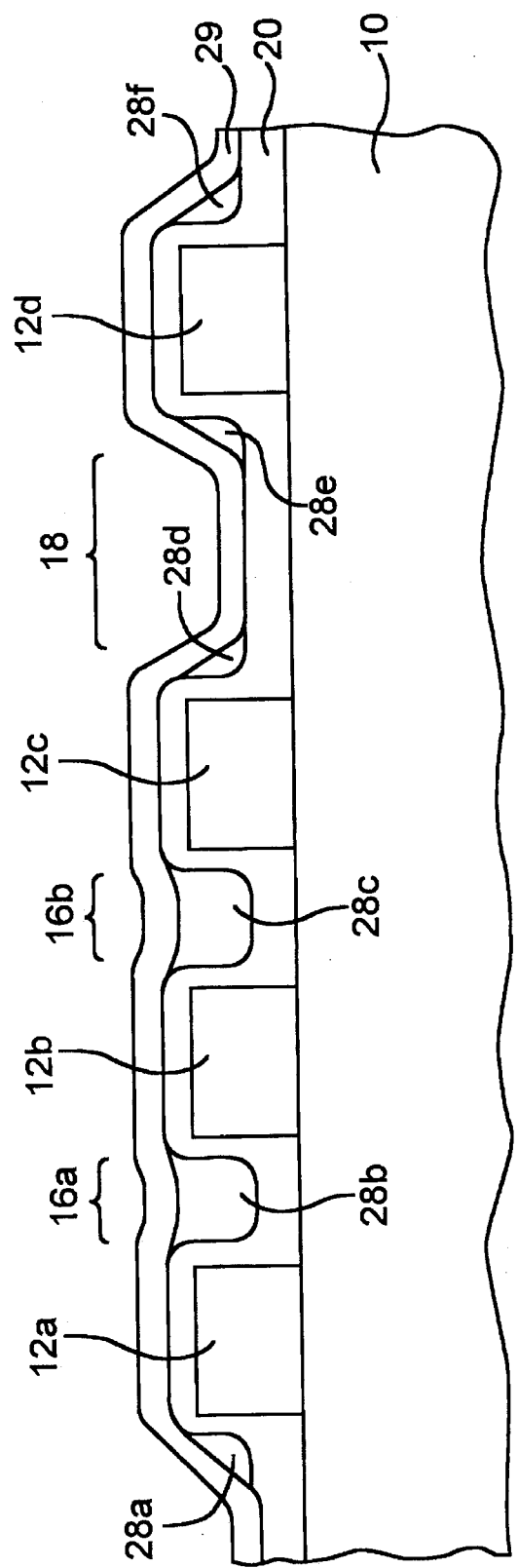
FIG. 5 is a partial cross-sectional view of the upper topography of FIG. 4 with a second PECVD silicon nitride layer deposited over the frontside surface.

FIG. 5 is a partial cross-sectional view of upper topography 10 of FIG. 4 with a second PECVD silicon nitride layer 29 deposited over frontside surface 14 of upper topography 10. Second PECVD silicon nitride layer 29 forms a conformal layer over the remaining isolated portions 28a–f of SOG layer 22 and the exposed, partially etched portions of first PECVD silicon nitride layer 20.

Figure 6:
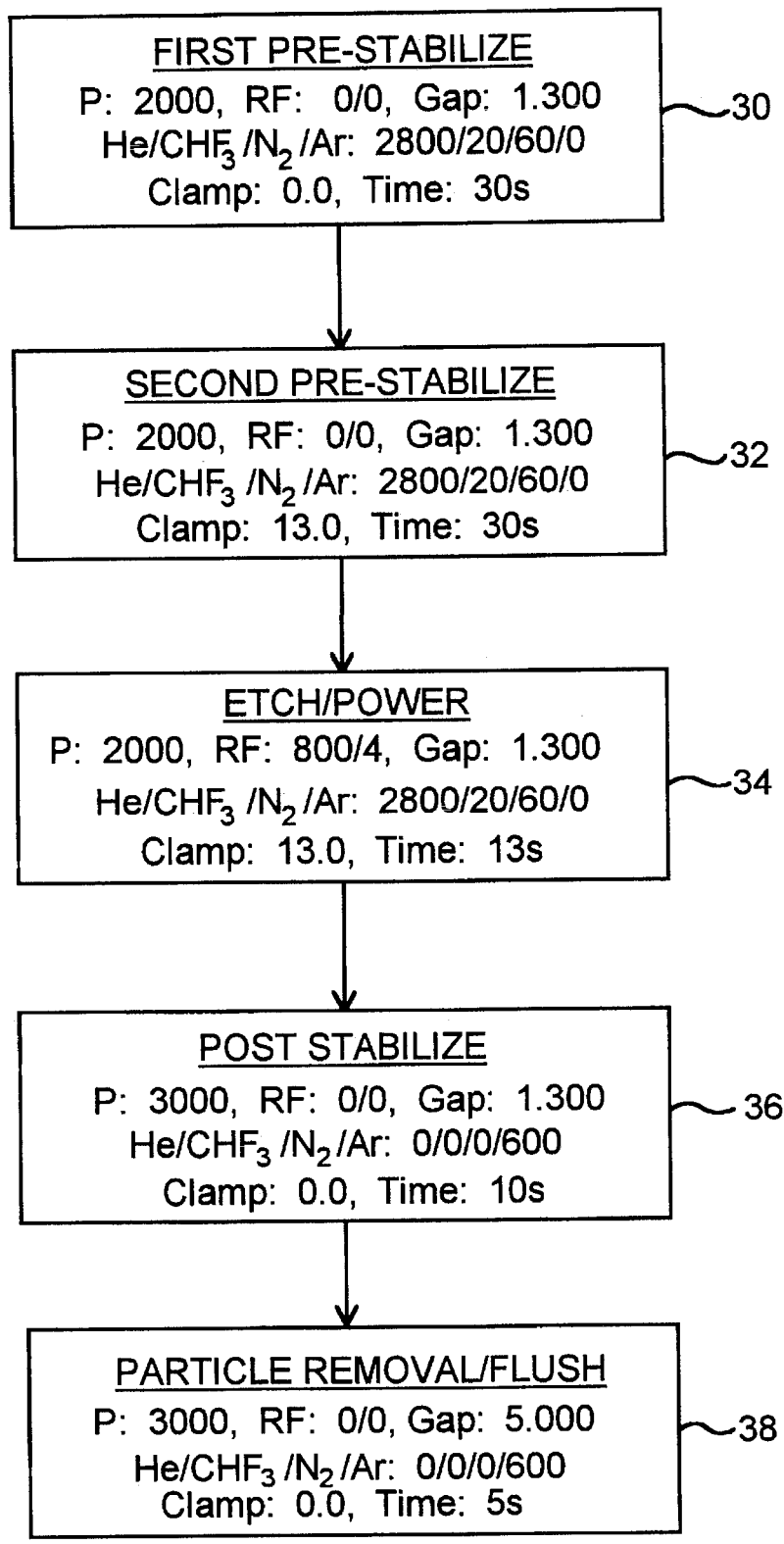
FIG. 6 is a flow diagram of the plasma etch process of the present invention.

Experiments conducted in order to optimize the present etch process of FIG. 6 yielded selectivities to PECVD silicon nitride of about 2.3, SOG etch rates of about 6,300 angstroms per minute, and etch non-uniformity values of about 3.1 percent across a frontside surface of a silicon wafer. Etch non-uniformity was measured by first forming a layer of SOG over a frontside surface of a silicon wafer. The SOG layer was then etched back using the present technique. SOG layer thickness was then measured at 49 sites on the frontside surface. Percent non-uniformity is equal to the standard deviation of the 49 measurements times 100 and divided by the mean.

It will be appreciated to those skilled in the art having the benefit of this disclosure that this invention is believed to be capable of selective etching of SOG layers used in dielectric-SOG-dielectric structures. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for removing a portion of a spin-on glass (SOG) layer formed over a layer of PECVD silicon nitride on a frontside surface of an upper topography of a silicon wafer, comprising the steps of:

placing the silicon wafer in a gap between a pair of electrodes arranged within a reaction chamber;

establishing a flow of He, $CHF_3$, and $N_2$ gases through said reaction chamber;

adjusting the pressure within said reaction chamber;

applying RF power between the pair of electrodes for selectively etching said SOG layer to said silicon nitride layer on said silicon wafer;

ceasing the flow of He, $CHF_3$, and $N_2$ gases through said reaction chamber; and establishing a flow of argon (Ar) gas through said reaction chamber in order to expel etch by-products from the reaction chamber.

2. The method as recited in claim 1, wherein the reaction chamber is evacuated prior to the placing step.

3. The method as recited in claim 2, wherein the step of adjusting the pressure within said reaction chamber comprises increasing the pressure within said reaction chamber to 2,000 mTorr.

4. The method as recited in claim 1, wherein the pressure within the reaction chamber is at atmospheric pressure during the placing step.

5. The method as recited in claim 4, wherein the step of adjusting the pressure within said reaction chamber comprises reducing the pressure within said reaction chamber to 2,000 mTorr.

6. The method as recited in claim 1, further comprising the step of adjusting the gap between the pair of electrodes to 1.300 cm, wherein said gap adjusting step precedes the RF power application step.

7. The method as recited in claim 1, wherein the flow rate of He gas established during said step of establishing a flow of He, $CHF_3$, and $N_2$ gases is 2,800 sccm.

8. The method as recited in claim 1, wherein the flow rate of $CHF_3$ gas established during said step of establishing a flow of He, $CHF_3$, and $N_2$ gases is 20 sccm.

9. The method as recited in claim 1, wherein the flow rate of $N_2$ gas established during said step of establishing a flow of He, $CHF_3$, and $N_2$ gases is 60 sccm.

10. The method as recited in claim 1, wherein said step of establishing a flow of He, $CHF_3$, and $N_2$ gases through said reaction chamber comprises establishing an He gas flow rate of 2,800 sccm, a $CHF_3$ gas flow rate of 20 sccm, and an $N_2$ gas flow rate of 60 sccm through said reaction chamber.

11. The method as recited in claim 1, wherein the amount of RF power applied between the pair of electrodes during the RF power application step is 800 watts.

12. The method as recited in claim 1, wherein the RF power application step is carried out for a time period of 13 seconds.

13. The method as recited in claim 1, further comprising the step of increasing the pressure within said reaction chamber, wherein said pressure increasing step follows the step of ceasing the flow of He, $CHF_3$, and $N_2$ gases.

14. The method as recited in claim 13, wherein the pressure established within the reaction chamber during the step of increasing the pressure within said reaction chamber is 3,000 mTorr.

15. The method as recited in claim 1, wherein the flow rate of argon (Ar) gas established during said step of establishing a flow of argon (At) gas is 600 sccm.

16. A method for removing a portion of a spin-on glass (SOG) layer formed over a layer of PECVD silicon nitride on a frontside surface of an upper topography of a silicon wafer, comprising the steps of:

placing said silicon wafer in a gap between a pair of electrodes arranged within a reaction chamber;

adjusting the gap between the pair of electrodes to 1.300 cm;

establishing a He gas flow rate of 2,800 sccm, a $CHF_3$ gas flow rate of 20 sccm, and a $N_2$ gas flow rate of 60 sccm through said reaction chamber;

adjusting the pressure within said reaction chamber to 2,000 mTorr;

applying 800 watts of RF power between the pair of electrodes for a time period of 13 seconds for selectively etching said SOG layer to said silicon nitride layer on said silicon wafer;

ceasing the flow of He, $CHF_3$, and $N_2$ gases through said reaction chamber;

increasing the pressure within said reaction chamber to 3,000 mTorr; and establishing an argon (Ar) gas flow rate of 600 sccm through said reaction chamber in order to expel etch by-products from the reaction chamber.

* * * * *